Jan. 8, 1963 W. L. BERLINGHOF 3,072,500

PRINTED CIRCUIT

Filed May 6, 1959

INVENTOR.
WILLIAM L. BERLINGHOF

BY William E. Cleaver

AGENT

United States Patent Office 3,072,500
Patented Jan. 8, 1963

3,072,500
PRINTED CIRCUIT

William L. Berlinghof, Huntingdon Valley, Pa., assignor to Motsoa Services Incorporated, a corporation of Pennsylvania Filed May 6, 1959, Ser. No. 811,481
2 Claims. (Cl. 117—212)

Figure 1:
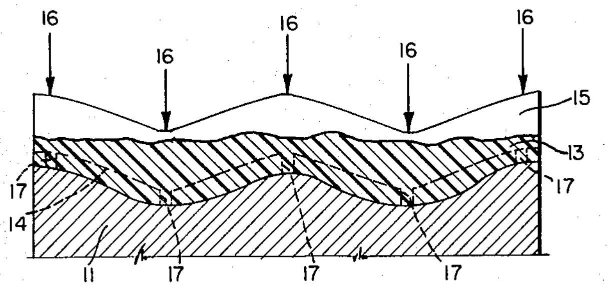

This invention relates to printed circuits.

In certain scientific endeavors it is necessary for equipment to be sensitive to any distortions, or bending, of an associated housing means. For instance, in testing the force necessary to bend particular material a certain number of degrees, it is necessary for associated equipment in the test set-up to be sensitive to detect at what force the material was bent to the predetermined angle.

Printed circuits lend themselves to providing a means for sensing distortions, or bending, of housing means. If circuit continuity of a printed circuit is broken in response to bending an associated housing means, such a circuit interruption will be sufficient to give rise to an indication of the bend. In order to provide a physical break in the printed circuit the material of the circuit itself must be brittle and/or the dielectric material which normally separates a printed circuit from a metal housing must be of a frangible nature.

In addition to being frangible the dielectric material with the printed circuit thereon must be coated onto the housing surface uniformly thin in order to respond with a physical break when the housing means bends. Very often in the past it has been a problem to get the dielectric uniformly thin since the surface upon which it is coated is irregular and the dielectric coating to be uniformly thin should follow the contours of the irregular surface.

It is an object of the present invention to provide an improved means for sensing distortions or bending of housing means.

It is another object of the present invention to provide a method for making a printed circuit on an irregular surface of a housing means which circuit will have its circuit continuity broken in response to bending the housing means upon which the circuit is printed.

In accordance with a main feature of the present invention there is provided a frangible dielectric material to be coated on the surface. The frangible dielectric material includes a resin binder making up by weight 20% to 60%. The resin binder acts as a vehicle to have the other components of the dielectric mixed therein. The other components consist of (*a*) mineral filler (in the preferred embodiment calcium carbonate) making up by weight 30% to 65%; (*b*) finely divided porous silica making up by weight 1% to 5%; (*c*) coloring filler making up by weight 2% to 10% and (*d*) catalyst material (in the preferred embodiment a relatively non-toxic amine hardener) making up by weight 5% to 6%. The ranges of percentages are suggested because depending on the angle of bend at which the frangible material is predetermined to break the components' percentage make-up is differently selected.

In accordance with another main feature of the present invention there is provided a method for drawing down the material on an irregular surface so that the material follows the contours of the surface.

In accordance with another feature and in conjunction with the last mentioned feature, a method is taught for applying a printed circuit to the frangible dielectric coating.

Figure 5:
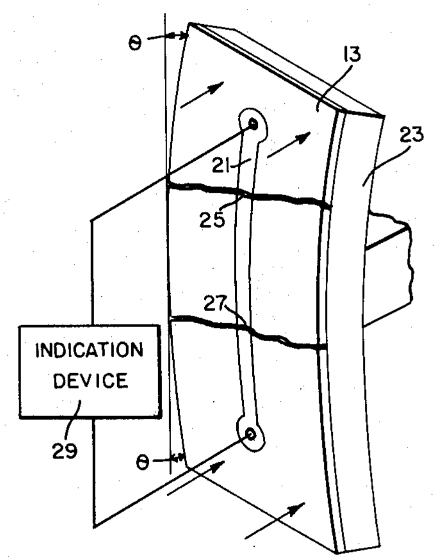

The foregoing and other objects and features of this invention will be best understood by reference to the following description of the invention taken in conjunction with the acommpanying drawings, wherein FIG. 1 through FIG. 4 show pictorial schematics of a drawing-down operation of the material on an irregular surface;

FIG. 5 is a pictorial schematic of a housing means bending and the circuit breaking in response thereto.

As was suggested earlier printed circuits lend themselves to providing means for detecting any bending of a housing means upon which the circuit is printed. In essence an arrangement which will cause a physical interruption of the printed circuit can be considered a mechanical fuse.

In order to provide a dielectric coating (in the preferred embodiment the housing means is considered metal thereby requiring a dielectric coating to insulate the printed circuit) and a printed circuit thereon which will fill the needs of the mechanical fuse a mixture of certain components has been found desirable. There is first provided a vehicle or binder for the dielectric coating which will, (*a*) have the capacity (high loading tolerance) to hold the other necessary components of the coating, which will (*b*) have a workable viscosity to enable it to be spread, which will (*c*) have relatively low electrical conductivity (good dielectric qualities) and which will (*d*) in and of itself harden to a degree of brittleness upon curing. In addition the vehicle should be heat resistant if it is to be used over a large range of ambient temperatures, that is, there should be a high softening point. A resin binder such as generally described under Epon Resins on page 77 of the Handbook of Material Trade Names, Supplement No. 1, by Zimmerman and Lavine, published by Industrial Research Service, Inc., Dover, New Hampshire, can be used for the vehicle and fills the requisites described above. The epoxy resin Shell Chemical Epon 828 is used in a preferred embodiment. Other epoxy resins which might be used are Dow Chemical Epoxy Novolacs and Union Carbide Diepoxides.

Since the mechanical fuse must have highly brittle characteristics there is added to the resin binder a substantial quantity of mineral filler, which in the preferred embodiment is calcium carbonate. Minerals can be considered as having zero elasticity for purposes of this invention. Therefore when the calcium carbonate is added and the package cured, the dielectric coating becomes highly frangible. In addition the calcium carbonate (as would other selected fillers), does not detract from the dielectric properties of the coating.

There is also added to the dielectric coating material another component, finely divided porous silica to secure another desirable property for the coating material. In the preferred embodiment Cab-o-sil, manufactured by Godfrey Cabot, Inc., is used, although other porous silicas could be substituted. The porous silica component acts as a thixotropic agent and enables the coating to assume a heavy viscous characteristic, i.e. to "stick" without flowing to curved surfaces after it has been spread thereon. Further, there is included in the coating mixture a coloring filler, which in the preferred embodiment is Ferro Corporation Yellow F–5512. Other suitable coloring fillers can obviously be used. The coloring filler enables a visual check to be made on the surface. If the coating is too thin, for instance, in a particular area there will be a shadow in that area caused by the housing surface showing through and the color added to the coating accentuates the shadow, thereby providing a basis for a visible check.

Finally, there is added to the mixture a catalyst agent which in the preferred embodiment is Shell Chemical Company catalyst "T" which is a liquid polyamine. The coating is eventually cured under moderately high temperatures to achieve optimum brittleness and the problems encountered with trapped air bubbles in heat curing operations, in general, are present in this operation. Therefore the liquid polyamine is of the low temperature setting type in order to provide a partial curing of the coating at room temperatures. Since the coating is partially cured the air bubbles become set at room temperature and any subsequent heating cannot cause such trapped air to expand (although the heated air will be exerting pressure). It becomes clear that once the liquid polyamine is added the coating must be applied before not too long a time has elapsed lest the coating will be unworkable. It has been found that with the mixture just described there is a "working time" of approximately 30 minutes. Catalysts of the type required in this invention are very often toxic and since the spreading of the coating is normally accomplished by humans, rather than machines, it is important to choose a relatively non-toxic catalyst agent such as the above specified liquid polyamine.

The circuit configurations are printed with an ink that comprises finely divided conductive metal particles, in the preferred embodiment silver, in a thermoset resin mixture. An ink such as Motson Company C93B can be used. The final coating which is applied to the printed circuits and the dielectric coating is an epoxy resin coating system such as Shell Chemical XA–200.

The surface of the housing means upon which the mechanical fuse is to be placed is of course cleaned by the usual surface cleaning techniques. The dielectric coating, having had its components suitably mixed, is applied to the surface in an initially thin coating. The coating material is then drawn down with a semi-flexible drawing tool which has spacer members to provide the predetermined thickness, which thickness in a preferred embodiment is 20 mls.

The novel drawing-down operation is better understood from a description of FIGS. 1 through 4. Referring to FIG. 1 the irregular surface 11 of the housing means has the dielectric coating 13 initially applied.

In FIG. 1 the semi-flexible drawing tool 15 with the spacer members 17 is shown prior to removing the excessive coating. The drawing tool 15 is drawn forth with pressure exerted as shown by the arrows 16 at the spacer positions, to remove the excessive coating.

Figure 2:
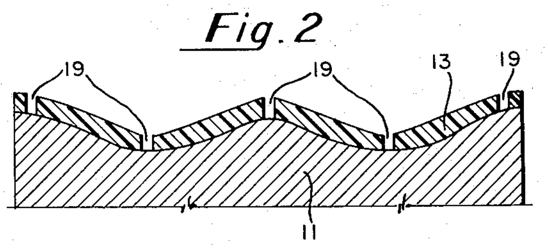

As shown in FIG. 2 the coating 13 remains at the predetermined thickness but includes grooves 19 which result from the spacer members as they are moved forth. The positions and numbers of the spacer members are chosen to fit into the valleys and onto the hills of the irregular housing surface in order that the lower edge 14 of the drawing tool 15 can follow the contour of the irregular surface. If the curvature of the surface of the housing means is relatively sharp then a drawing tool with many spacers must be used accordingly.

Figure 3:
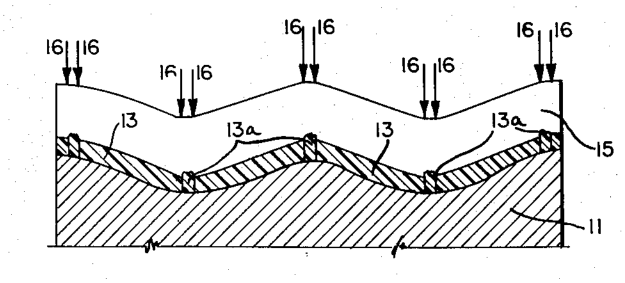
Figure 4:
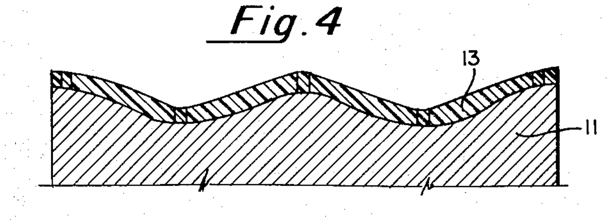

After the coating 13 (FIG. 2) has been partially cured, additional uncured or unhardened coating material 13*a* is added to the grooves, as shown in FIG. 3. A drawing tool 15 without spacer members is used in a drawing operation to remove the portion of the coating 13*a* which is excessive, thereby leaving a coating 13, which is uniformly thin over the irregular surface, as shown in FIG. 4.

The coating with the liquid polyamine therein, as described, is permitted to harden at room temperature preferably 4 to 5 hours (and if a longer time (8 hours) can be scheduled it is desirable for the operation to have a longer time). The housing means with the coating thereon is then subjected to heat, the temperature being gradually raised to 300° F. (at 50° F. increments) whereat the temperature is held for ½ hour. After this partial curing of the coating material, the layout for the printed circuit is arranged.

Assuming that the paths of the printed circuit have been predetermined, there is cut a template from which to pattern the circuit layout on the coating surface. In the preferred embodiment the template is made from Mylar to be easily adapted to rolled curved surfaces. The template is placed on the dielectric coating and the circuit pattern is marked out. The template is then removed and the dielectric surface is masked with tape excepting along the paths marked out for the circuit. The unmasked circuit paths are then coated with conducting metal ink to a thickness of approximately 1 to 3 mils, in the preferred embodiment, although other suitable thickness can be attained. The package is then cured at 200° F. for 30 minutes, cooled and the masking tape removed. Any irregular circuit printing is then "touched up" or removed as the situation may necessitate. The package is then cured again at 300° F. for one hour. The printed circuit and the dielectric surface as a complete unit, with the exception of contacts, is then coated with an epoxy resin and the entire package finally cured for one hour at 300° F.

In FIG. 5 there is shown the mechanical fuse operation. The printed circuits 21 on the housing means 23 is cracked at points 25 and 27. The dielectric being frangible could and does crack according to other formations than that shown in FIG. 5. The indicating device 29 indicates when the circuit is broken and this indication can readily be graduated in units of force. Although the mechanical fuse device of the printed circuit in FIG. 5 is shown with a strain gauge type of arrangement, other utility is known for the device.

As indicated above, the components of the dielectric mixture can be chosen in proper weight mixtures to enable the dielectric coating to break at various predetermined angles. As guide criteria, the following percentages were used in making up the dielectric in a preferred embodiment to cause a circuit fracture below 20° deflection of the housing as indicated by the angle $\theta$ in FIG. 5: Resin binder making up by weight 37.5%; calcium carbonate by weight 49.2%; Cab-o-sil by weight 2.9%; Ferro Corporation Yellow F–5512 by weight 4.3% and liquid polyamine by weight 5.8%. The foregoing mixture produces a viscous coating which can be worked onto cylindrical and uneven surfaces.

While I have described above the principles of my invention in connection with specific apparatus, it is to be clearly understood that this description is made only by way of example and not as a limitation to the scope of my invention as set forth in the objects thereof and in the accompanying claims.

What I claim is:

1. A method for making a printed circuit on an irregular surface which has a fuse arrangement which will interrupt circuit continuity in response to bending a housing means upon which the circuit is printed comprising the steps of applying dielectric coating material while in its viscous uncured form to said irregular surface in a thickness greater than a selected thickness necessary for breaking, spacing suitable drawing means in the valleys and on the hills of said irregular surface while drawing down said coating material to said selected thickness leaving grooves along said valleys and on said hills, partially curing said coating material, filling said grooves with an additional amount of said uncured coating material, pressuring a suitable drawing means against the tops of said grooves while drawing down said groove filling coating material, and completely curing said coating thereby producing a frangible dielectric coating, marking paths for the circuit layout on said frangible dielectric coating, masking said frangible dielectric coating excepting along said marked paths, coating conducting metal ink in uncured form onto said marked paths, partially curing said inked areas, removing any masking, and completely curing said inked area.

2. A printed circuit having a fuse arrangement which will interrupt circuit continuity in response to bending a housing means upon which the circuit is printed comprising a frangible dielectric coating which is coated onto the surface of a housing means, wherein said frangible dielectric coating consists essentially of (*a*) an epoxy resin binder making up by weight 20% to 60% of said frangible dielectric coating, (*b*) finely divided mineral filler with brittle characteristics making up by weight 30% to 65% of said frangible dielectric coating, (*c*) finely divided porous silica making up by weight 1% to 5% of said frangible dielectric coating, (*d*) coloring filler making up by weight 2% to 10% of said frangible dielectric coating, (*e*) catalyst material making up by weight 5% to 6% of said frangible dielectric coating, said frangible dielectric coating being coated onto said surface in a sufficiently thin layer and cured so as to break in response to bending said housing means, and a printed circuit printed onto the surface of said frangible dielectric coating so that in response to the breaking of said frangible dielectric coating said printed circuit continuity is broken.

References Cited in the file of this patent

UNITED STATES PATENTS

| | | |
|---|---|---|
| 1,867,068 | Fowler | July 12, 1932 |
| 2,075,836 | Spafford | Apr. 6, 1937 |
| 2,679,569 | Hall | May 25, 1954 |
| 2,754,230 | McLean et al. | July 10, 1956 |
| 2,768,992 | Zukas | Oct. 30, 1956 |
| 2,773,048 | Formo et al. | Dec. 4, 1956 |
| 2,776,235 | Peck | Jan. 1, 1957 |
| 2,779,975 | Lee et al. | Feb. 5, 1957 |
| 2,791,668 | Cowdrey et al. | May 7, 1957 |
| 2,795,680 | Peck | June 11, 1957 |
| 2,806,915 | Fowler | Sept. 11, 1957 |
| 2,830,918 | Zimmerman | Apr. 15, 1958 |
| 2,939,807 | Needham | June 7, 1960 |
| 2,943,956 | Robinson | July 5, 1960 |
| 2,947,829 | Fish | Aug. 2, 1960 |
| 2,959,498 | Sweeny | Nov. 8, 1960 |